US012336110B2

United States Patent
Leung et al.

(10) Patent No.: US 12,336,110 B2
(45) Date of Patent: Jun. 17, 2025

(54) SYSTEMS FOR DISMANTLING OF DOUBLE-SIDED PCBA

(71) Applicant: Intelligent Memory Limited, Kwai Chung (HK)

(72) Inventors: Ho Wai Phyllis Leung, Ma Wan (HK); Fung Ling Yeung, Tuen Mun (HK); Nok Him Chan, Sheung Shui (HK)

(73) Assignee: Intelligent Memory Limited, Kwa Chung (HK)

( * ) Notice: Subject to any disclaimer, the term of this patent is extended or adjusted under 35 U.S.C. 154(b) by 300 days.

(21) Appl. No.: 18/122,995

(22) Filed: Mar. 17, 2023

(65) Prior Publication Data

US 2024/0314994 A1     Sep. 19, 2024

(51) Int. Cl.
*H05K 13/04*     (2006.01)
*H05K 1/02*      (2006.01)

(52) U.S. Cl.
CPC ....... *H05K 13/0486* (2013.01); *H05K 1/0203* (2013.01); *H05K 2201/066* (2013.01); *H05K 2201/10734* (2013.01)

(58) Field of Classification Search
CPC ....... H05K 2203/0445; H05K 13/0486; B23K 1/018
USPC .......................................................... 228/191
See application file for complete search history.

(56) References Cited

U.S. PATENT DOCUMENTS

| | | | | |
|---|---|---|---|---|
| 4,813,589 | A * | 3/1989 | Palmer | B23K 1/012 228/264 |
| 5,560,531 | A * | 10/1996 | Ruszowski | B23K 1/008 228/264 |
| 5,715,592 | A * | 2/1998 | Mori | H05K 13/0486 228/264 |
| 5,735,450 | A * | 4/1998 | Heim | B23K 1/012 228/232 |
| 5,758,817 | A * | 6/1998 | Chapman | H05K 13/0486 228/19 |
| 6,034,875 | A * | 3/2000 | Heim | H01L 23/3672 257/E21.511 |
| 6,906,924 | B2 * | 6/2005 | Luebs | H05K 3/3494 361/689 |
| 7,621,033 | B2 * | 11/2009 | Rochford | H05K 13/0491 29/402.21 |
| 8,537,547 | B2 * | 9/2013 | Liu | B23K 1/018 174/547 |
| 10,154,612 | B1 * | 12/2018 | Sun | H05K 7/20163 |

(Continued)

FOREIGN PATENT DOCUMENTS

| | | |
|---|---|---|
| CN | 110662410 | 1/2020 |
| CN | 112236028 | 1/2021 |

(Continued)

*Primary Examiner* — Keith Walker
*Assistant Examiner* — Carlos J Gamino
(74) *Attorney, Agent, or Firm* — Fish IP Law, LLP; Tomas A. Prieto

(57) ABSTRACT

A system for dismantling defective BGA chips from double-sided PCBA having a fix stage and a cooling stage. The fix stage includes at least one shield that prevents hot air from a hot air gun to heat BGA chips that are adjacent to the defective BGA chips. The cooling stage prevents overheating of the BGA chips that are on the opposite side of the double-sided PCBA by conducting heat away from the BGA chips during the process.

13 Claims, 5 Drawing Sheets

(56) References Cited

U.S. PATENT DOCUMENTS

| | | | | |
|---|---|---|---|---|
| 11,791,239 | B2* | 10/2023 | Teng | H01L 23/49816 |
| | | | | 361/690 |
| 2006/0076388 | A1* | 4/2006 | Sato | B23K 1/018 |
| | | | | 228/102 |
| 2009/0166397 | A1* | 7/2009 | Meng | B23K 1/018 |
| | | | | 228/191 |
| 2016/0192549 | A1* | 6/2016 | Zheng | B26D 7/1863 |
| | | | | 29/762 |

FOREIGN PATENT DOCUMENTS

| | | | | |
|---|---|---|---|---|
| CN | 212677183 | | | 3/2021 |
| JP | 2007096088 | A | * | 4/2007 |
| KR | 20030070364 | A | * | 2/2002 |
| TW | 202228341 | | | 7/2022 |

* cited by examiner

SYSTEMS FOR DISMANTLING OF DOUBLE-SIDED PCBA

FIELD OF THE INVENTION

The field of the invention is electronic chip manufacturing.

BACKGROUND

The background description includes information that may be useful in understanding the present invention. It is not an admission that any of the information provided herein is prior art or relevant to the presently claimed invention, or that any publication specifically or implicitly referenced is prior art.

Pulling chip(s) such as ball grid array ("BGA") chips from printed circuit board assemblies ("PCBA") by heating with hot air gun is common way for replacing defective chip(s). However, this method may induce collateral heat damage to adjacent components, especially to heat-sensitive components (e.g. DRAM components). A higher risk of collateral heat damage may also be induced on PCBA with high component density and/or on double-sided PCBA with chips placed symmetrically on both sides.

There are several existing solutions (show below) of minimizing collateral heat damage induced during pulling chip(s):
  a) Use of cooling agent (e.g., cool air flow) to cool down adjacent component(s) when heating;
  b) Re-engineering BGA rework fixture (Hot gun nozzle with special shape and shielding cover with subtle pores placing on BGA chip(s) that need to be pulled out);
  c) Isolation of the rework BGA chip(s) which allows hot air flowing directly on the surface of the rework BGA chip(s). in order to protect adjacent components; and
  d) Use of thermal-resisted material to shield the adjacent components.

However, the following limitations are observed which do not suit for applications that involve pulling chips from double-sided PCBA especially for PCBA with symmetric BGA chips placed on both side. The limitations are:
  a) Insufficient consideration of potential collateral heat damage on adjacent chips located at the opposite side of the rework chips
  b) Lack of consideration of potential heat damage of chip opposite to rework chip due to heat conduction from rework chip to the opposite chip via solder joint and PCB, especially for PCBA design with symmetric placed BGA chips on both side
  c) Lack of consideration of potential collateral heat damage for high density SMT PCBA small size PCBA, double-sided PCBA with BGA chips placed symmetrically on both sides Thus, there is still a need for a system that provides for the effective and easy removal of a defective BGA chip from a double-sided PCBA while also protecting other BGA chips on both sides of the PCBA from damage due to the heating process.

SUMMARY OF THE INVENTION

The inventive subject matter provides apparatus, systems and methods for the removal of a defective BGA chip from a double-sided PCBA. The system includes a holder or holding area that is configured to hold a PCBA that is inserted in the system. A hot air gun is disposed to align with a defective BGA chip from a first side of the PCBA when the PCBA is installed within the system. At least one heat-resistant shield is movable via rails such that they can be moved into position to protect adjacent BGA chips on the first side of the PCBA from the heat emitted by the hot air gun.

The system also includes a cooling stage that has a cooling source feeding cooled air via a heat-dissipative tube towards the location of the PCBA. The heat-dissipative tube can be covered with a thermal-resistant coating or wrapping along the length of the tube, leaving an end of the tube exposed or unwrapped to come into contact with a BGA chip on the second side of the PCBA opposite the defective chip. The cooling stage also includes at least one heat-dissipative element (e.g., a heat sink) that is to the side of the heat-dissipative tube that comes into contact with adjacent BGA chips on the second side of the PCBA via heat-dissipative media (e.g., thermal paste) on the surface of the at least one heat-dissipative element.

Various objects, features, aspects and advantages of the inventive subject matter will become more apparent from the following detailed description of preferred embodiments, along with the accompanying drawing figures in which like numerals represent like components.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

The following description includes information that may be useful in understanding the present invention. It is not an admission that any of the information provided herein is prior art or relevant to the presently claimed invention, or that any publication specifically or implicitly referenced is prior art.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

Unless the context dictates the contrary, all ranges set forth herein should be interpreted as being inclusive of their endpoints and open-ended ranges should be interpreted to include only commercially practical values. Similarly, all lists of values should be considered as inclusive of intermediate values unless the context indicates the contrary.

As used in the description herein and throughout the claims that follow, the meaning of "a," "an," and "the"

includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

DETAILED DESCRIPTION

Throughout the following discussion, numerous references will be made regarding servers, services, interfaces, engines, modules, clients, peers, portals, platforms, or other systems formed from computing devices. It should be appreciated that the use of such terms, is deemed to represent one or more computing devices having at least one processor (e.g., ASIC, FPGA, DSP, x86, ARM, ColdFire, GPU, multi-core processors, etc.) programmed to execute software instructions stored on a computer readable tangible, non-transitory medium (e.g., hard drive, solid state drive, RAM, flash, ROM, etc.). For example, a server can include one or more computers operating as a web server, database server, or other type of computer server in a manner to fulfill described roles, responsibilities, or functions. One should further appreciate the disclosed computer-based algorithms, processes, methods, or other types of instruction sets can be embodied as a computer program product comprising a non-transitory, tangible computer readable media storing the instructions that cause a processor to execute the disclosed steps. The various servers, systems, databases, or interfaces can exchange data using standardized protocols or algorithms, possibly based on HTTP, HTTPS, AES, public-private key exchanges, web service APIs, known financial transaction protocols, or other electronic information exchanging methods. Data exchanges can be conducted over a packet-switched network, the Internet, LAN, WAN, VPN, or other type of packet switched network.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

Figure 1:
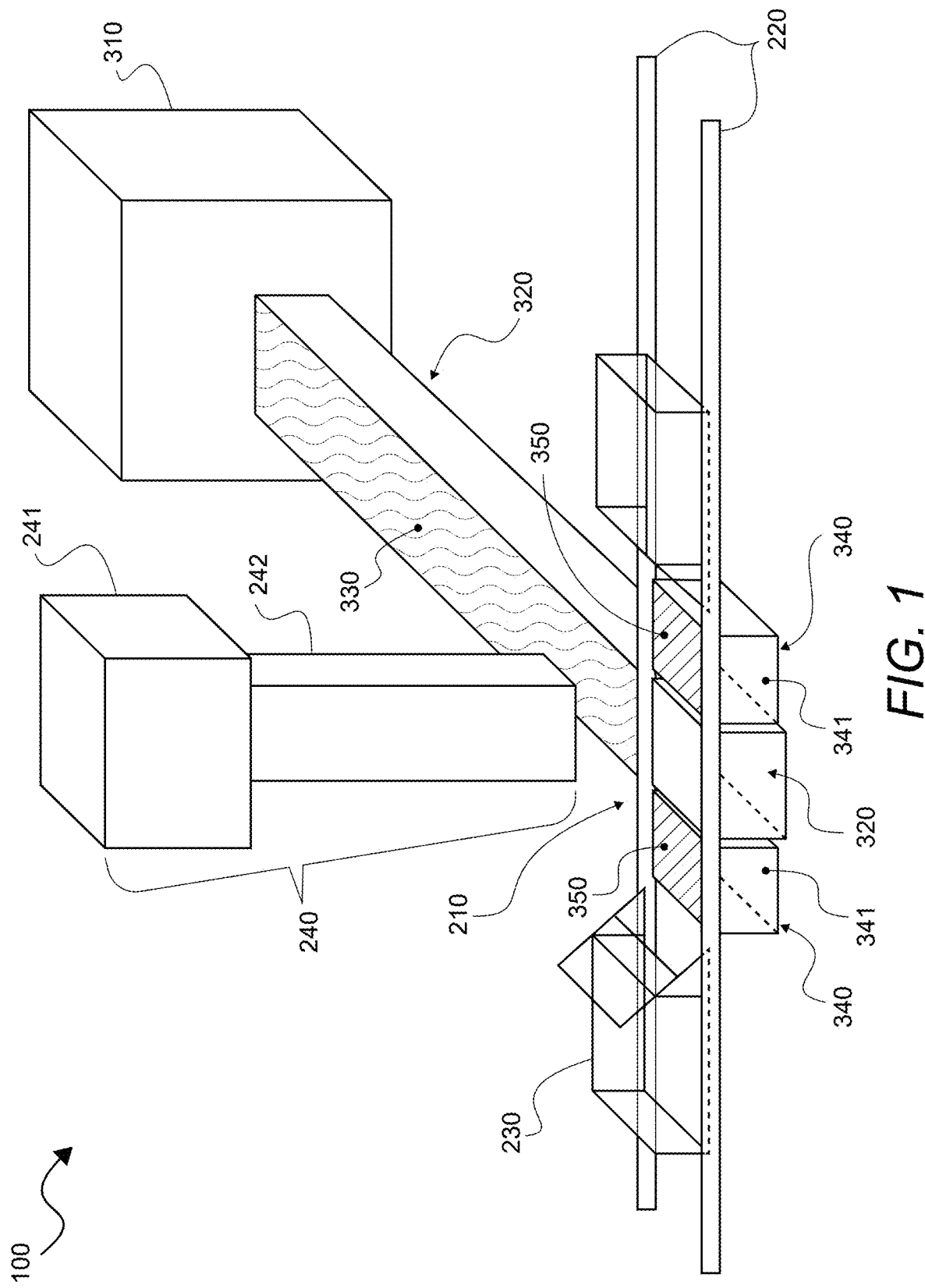
FIG. 1 is an illustrative diagram of a system from an isometric view, according to embodiments of the inventive subject matter.

FIG. 1 provides an illustrative diagram of a system 100 from an isometric view, according to embodiments of the inventive subject matter.

The system 100 can be generally considered to include a fix stage and a cooling stage.

The fix stage includes a holder 210 as well as a hot air gun 240 that heats the area with a defective chip for removal. The holder 210 in generally considered to be the location where a double-sided PCBA is attached to the system, as well as the mechanisms that hold the double-sided PCBA in place during the processes discussed herein.

The holder 210 can include clamps or other restraining devices that can firmly hold the double-sided PCBA when installed such that it does not move during the defective chip removal procedure. In embodiments, the holder 210 can be a cavity shaped to receive a PCBA such that the PCBA is deposited into the cavity and the shape of the cavity holds the PCBA in place.

As seen in FIG. 1, the fix stage includes a pair of rails 220 whose length encompasses the holder 210. In the embodiments shown herein, the rails 220 are disposed such that they are proximate to both sides of a PCBA that has been installed in the holder 210. The fix stage further includes at least one shield body cover 230 (the embodiments here illustrate a pair of shield body covers 230) that is slidably disposed on the rails 220 such that their position relative to an installed PCBA can be adjusted.

The figures herein show a pair of rails 220. However, it should be appreciated that systems with single rails are also contemplated.

Figure 2:
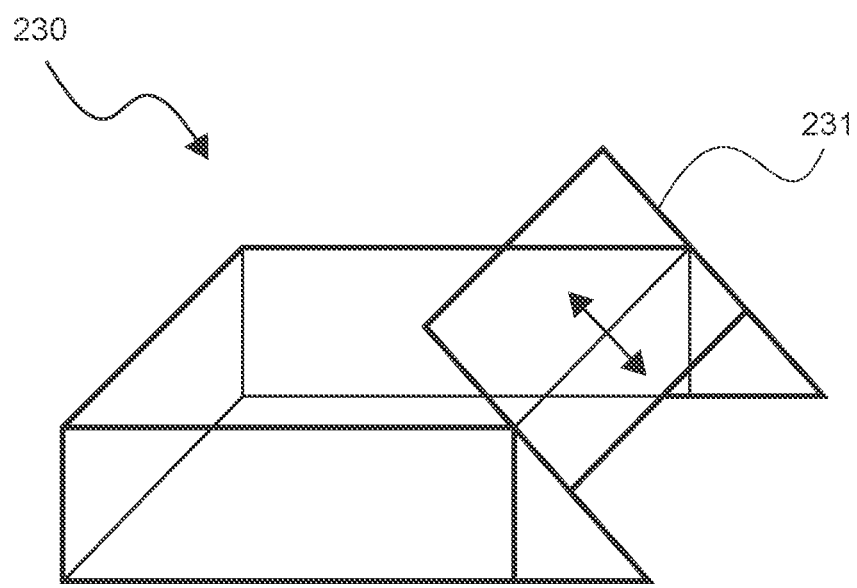
FIG. 2 shows a detailed view of a shield body cover, according to embodiments of the inventive subject matter.

FIG. 2 shows a detailed view of a shield body cover 230, according to embodiments of the inventive subject matter.

The shield body cover 230 is made of a heat resistant material that protects the BGA chip under the shield body cover from the heat emitted by the hot air gun 240 during the extraction process, as will be explained in greater detail below. As seen in FIG. 1, the shield body cover 230 is disposed on rails 220 such that the position of the shield body cover 230 can be adjusted relative to a double-sided PCBA installed within the fix stage.

The shield body cover 230 includes a sliding cover 231 that is also made of a heat resistant material (can be the same or different material from the rest of the shield body cover 230). An example of a suitable heat-resistant material that can be used for the shield body cover 230 and the sliding cover 231 is mica, though other heat-resistant materials such as alloys are contemplated. The sliding cover 231 can slide upward into an open position and then downward into a closed position, illustrated by the arrows in FIG. 2. In an open position, the sliding cover 231 provides sufficient clearance over the BGAs of the PCBA such that the shield body cover 230 can be adjusted properly along the rails 220. When the sliding cover 231 is slid downward into a closed position, the sliding cover 231 shields the BGA behind it from the heat emitted by the hot air gun 240.

Returning to the diagram of FIG. 1, the hot air gun 240 includes a heat source 241 and a muzzle tube 242. The heat source 241 can include a heating element and a fan or other form of fluid conduction to push hot air down through and out of the muzzle tube 242. The muzzle tube 242 is generally disposed centrally over area where the double-sided PCBA is installed within the fix stage such that the defective BGA chip to be removed is aligned with the open end of the muzzle tube 242.

The sliding shield body covers 230 serve to shield the BGA chips adjacent to the defective BGA chip to be removed. The cooling stage serves to protect the BGA chips on the second side of the double-sided PCBA, including a BGA chip that may be directly opposite the defective BGA chip.

It is contemplated that the rails 220 can extend further than what is depicted in the exemplary diagrams contained herein, to allow for sufficient space to install and remove PCBAs of varying lengths.

In embodiments of the inventive subject matter, other methods for adjusting the positions of the shield body covers 230 can be used. For example, the rails 220 can instead be a series of tabs (male member) or gaps (female member) with the shield body covers 230 having corresponding gaps (female member) or tabs (male member0, respectively, such that the covers 230 can be mated with the tabs/gaps of the rails 220 such that the position of the shield body covers 230 can be adjusted relative to the rails 220.

The cooling stage includes a cooling source 310, a heat dissipative tube 320 that is partially wrapped in a thermal resistant coating 330, at least one heat-dissipative element 340 (two are depicted herein) having a heat-dissipative media 350 disposed thereon. The heat-dissipative media 350 is depicted in FIG. 1 by the patterned surface. The heat-dissipative element 340 can be a high-heat dissipative alloy elements made of a high-heat dissipative alloy. It is preferred that the heat-dissipative element 340 dissipate heat faster than the heat dissipative tube 320.

In embodiments of the inventive subject matter, the heat-dissipative media 350 can comprise a thermal paste.

The thermal resistant coating 330 can be a layer of a paste or other thermally-resistant material coating at least a portion of the tube 320. In embodiments, the thermal resistant coating 330 can be a wrap of thermally-resistant/insulating material that is wrapped around at least a portion of the tube 320. The end of the tube 320 that is to contact a BGA chip is left unwrapped. which can be seen in FIG. 1.

The cooling source 310 includes a cooling fan or other form of fluid conduction means and a cooling element (e.g., a refrigerant system or other cooling system known in the art). The cooling source is coupled with the heat dissipative tube 320 such that air can be cooled by the cooling element and pushed by the fan through the heat dissipative tube 320.

The heat dissipative tube 320 can be made from a heat-dissipative alloy or other heat-dissipative material.

As seen in FIG. 1, the heat-dissipative tube 320 extends into the fix stage such that it aligns with the end of muzzle tube 242. The heat-dissipative tube 320 is positioned such that when a double-sided PCBA board is installed, the BGA chip opposite the defective BGA chip to be removed comes into contact with the heat dissipative tube 320. It should be noted that this section of the heat-dissipative tube 320 is not covered by the thermal resistant coating 330. The thermal resistant coating 330 (depicted via the patterned section in FIG. 1 and other figures) protects the length of the heat-dissipative tube 320 from exposure to the hot air emitted by the hot air gun 240. In the figures, the thermal resistant coating 330 is only shown on one side (the top side) of the heat-dissipative tube 320. However, it is contemplated that the thermal resistant coating 330 can cover multiple sides of the section of the tube 320 shown, including wrapping the tube 320 on all sides.

Near the end of the heat-dissipative tube 320, there is an exposed surface that is not covered by the thermal resistant coating 330. This section will come into contact with a BGA chip as will be described in further detail below.

The heat-dissipative element 340 are disposed on either side of the end section of the heat-dissipative tube 320 such that each of the heat-dissipative element 340 align with one or more BGA chips on the second side of the PCBA that are adjacent to the BGA chip opposite the defective BGA chip.

The heat-dissipative media 350 is disposed on the side of the heat-dissipative alloys 340 that face an installed PCBA such that when the PCBA is installed, the corresponding BGA chips (adjacent to the BGA chip opposite the defective BGA chip) come into contact with the heat-dissipative media 350.

It should be noted that in the embodiments of the inventive subject matter discussed herein, the heat dissipative alloy elements 340 do not come into contact with the heat-dissipative tube 320. This is so that the heat dissipation rates are different for the chips contacted by the heat-dissipative element 340 (via heat-dissipative media 350) versus the chip contacted by the heat-dissipative tube 320. The dissipation rate of the heat-dissipative tube 320 is lower than that of the heat-dissipative element 340 (e.g., heat sinks). This prevents the heat dissipation of the chip opposite the defective chip from being too fast and thus interfering in the removal process by making it more difficult to properly heat the solder of the defective chip for removal.

In embodiments of the inventive subject matter such as the one shown herein, the heat-dissipative elements 340 comprise heat sinks 341. However, other heat-dissipative structures (such as other heat-dissipative alloy structures) are suitable for the heat conduction purposes discussed herein.

Figure 3:
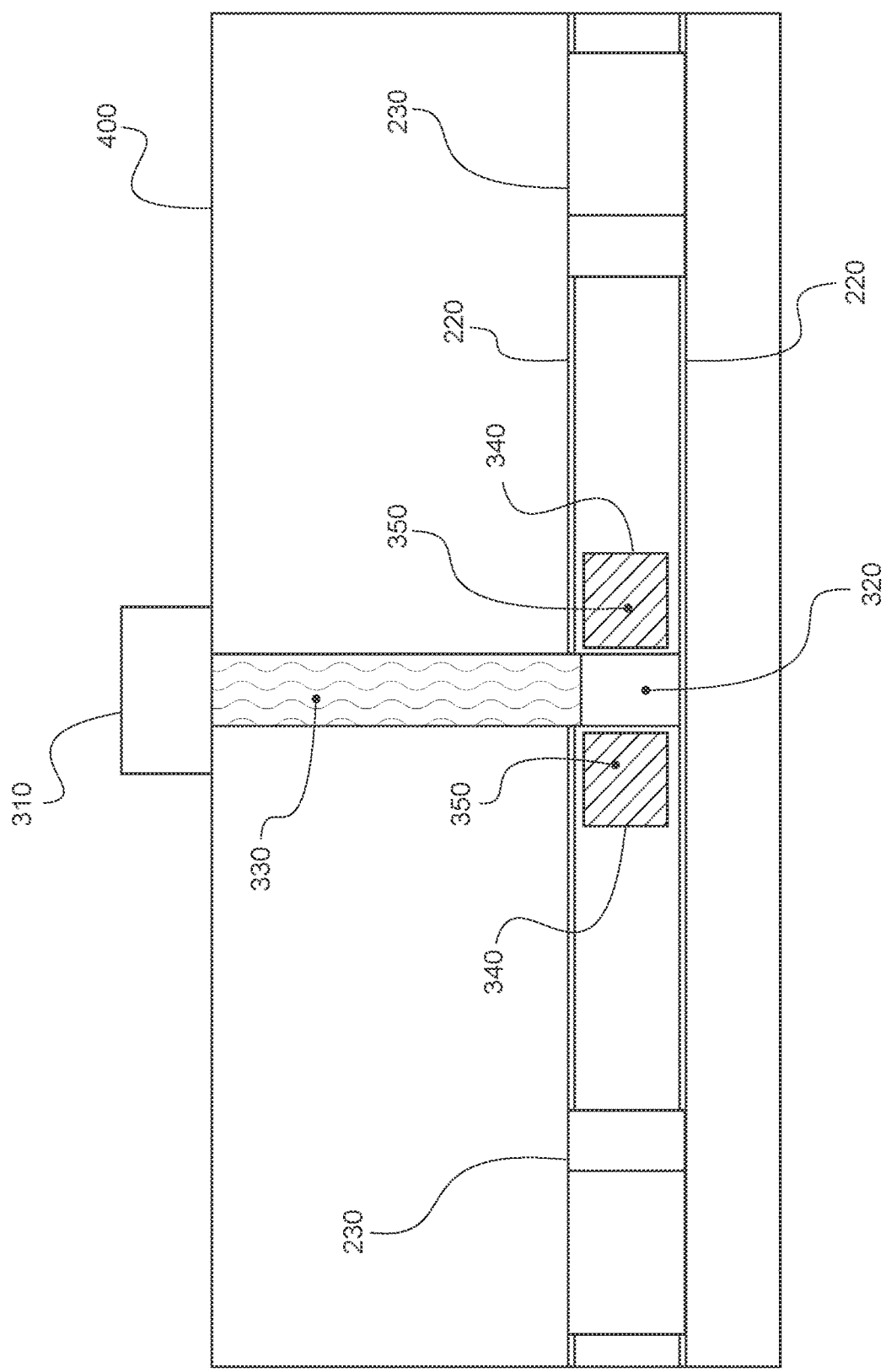
FIGS. 3 and 4 show top and front views, respectively, of these elements disposed on a platform of the fix stage.
Figure 4:
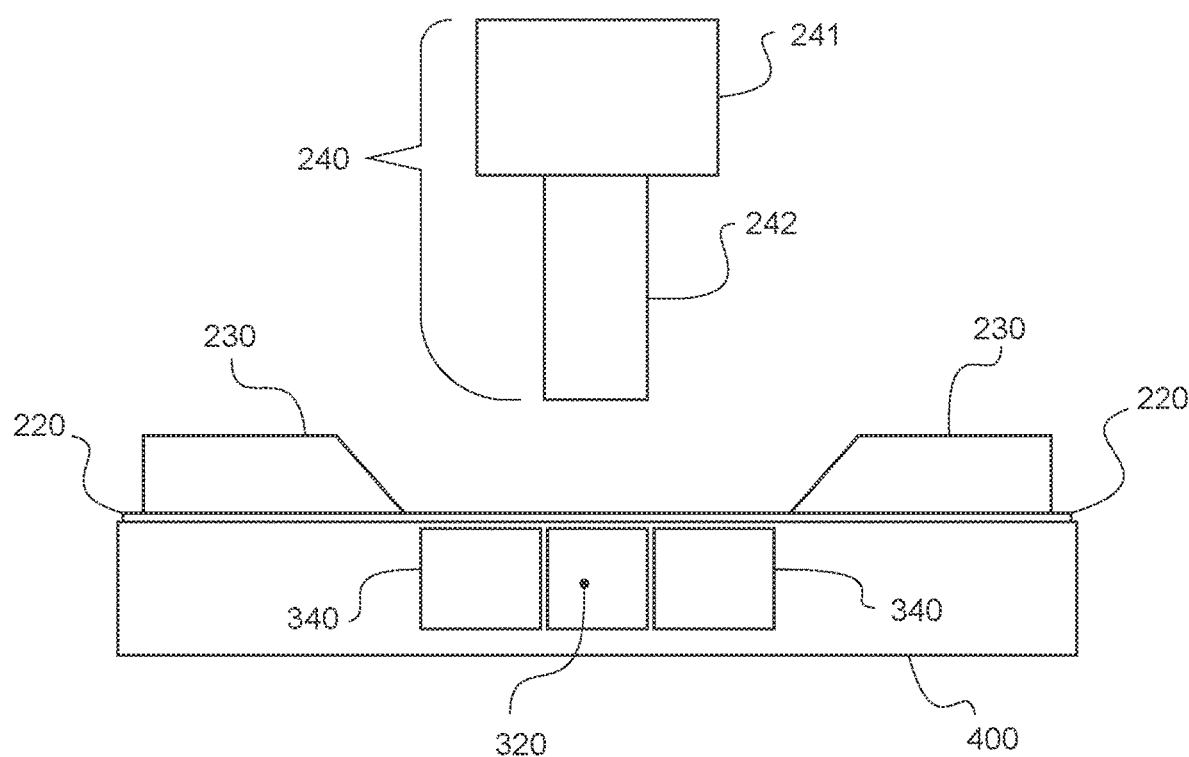

In embodiments of the inventive subject matter, certain elements of the system 100 can be disposed on a platform 400, which can be considered part of the fix stage. FIGS. 3 and 4 show top and front views, respectively, of these elements disposed on the platform 400. The platform 400 generally is made of a rigid material that provides support for the PCBA holder and the rails 220. Preferably, the platform 400 is made of a rigid material with low heat conductivity. Suitable materials can include wood, plastics, cardboard, etc. Metals with rubber, plastic or other components to prevent unwanted heat dissipation can also be used.

In the view of FIG. 3, the hot air gun 240 is not shown so that the assembly of the remaining components can be clearly seen.

FIG. 3 shows the alignment of the different components from the top view. From this view, the rails 220 are seen with the sliding shield body covers 230 attached thereto, such that they can slide along the rails 220 into a desired position. Also visible in the top view is how the heat-dissipative tube 320 and the heat-dissipative element 340 (having the heat-dissipative media 350 disposed on top) align relative to the rails 220.

In embodiments of the inventive subject matter where a platform 400 is used, certain elements of the system can be disposed into cavities within the platform 400. The front view of FIG. 4 illustrates how the heat-dissipative tube 320 and the heat-dissipative element 340 are disposed in cavities within the platform 400. The rails 220 are disposed on the surface of the platform 400. The cavity of the platform 400 that contains the heat-dissipative tube 320 can be dimensioned such that an open end of the heat-dissipative tube 320 empties into the environment. Thus, in the view of FIG. 3, the heat-dissipative tube 320 would vent air in the direction "towards" the page.

In embodiments, the platform 400 can help to insulate portions of the heat-dissipative tube 320 that contact the platform 400 when the tube 320 is disposed in its corresponding cavity within platform 400.

Figure 5:
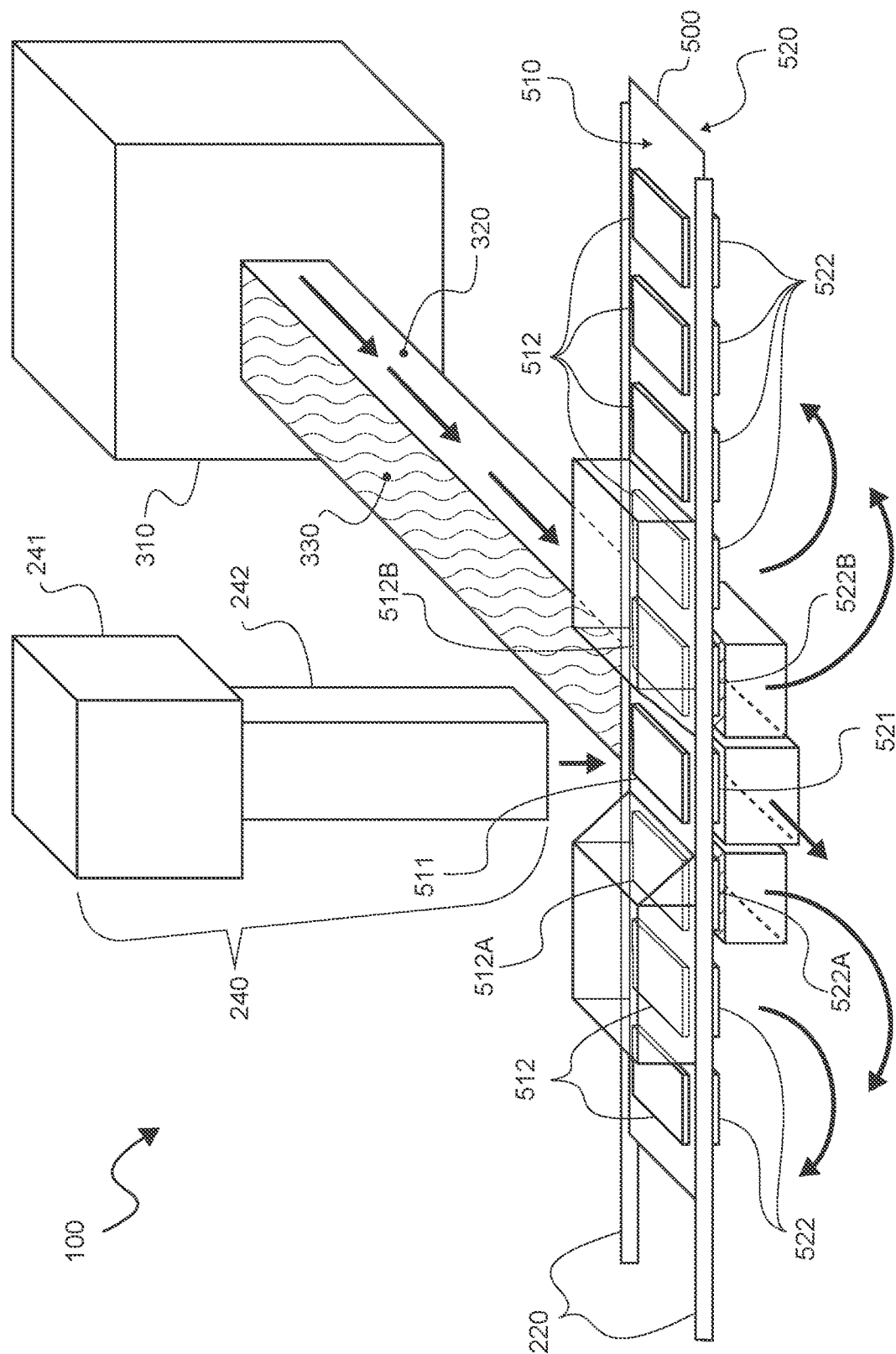
FIG. 5 shows a perspective view of the system with a double-sided PCBA installed, showing how the system works in operation.

FIG. 5 shows a perspective view of the system 100 of FIG. 1 with a double-sided PCBA 500 installed, showing how the system works in operation. The double-sided PCBA 500 has a symmetrical arrangement of BGA chips on both sides. For the purposes of clarity, the platform 400 is not illustrated in FIG. 5, but it is understood that in operation the platform 400 or other platform may be used to support the system.

The double-sided PCBA 500 has a first side 510 and a second side 520. The first side includes the defective BGA chip 511 and a series of non-defective BGA chips 512. The second side 520 includes a series of non-defective BGA chips that includes the BGA chip 521 that is directly opposite the defective BGA chip 511 and other BGA chips 522 that are opposite the non-defective BGA chips 512 from the first side.

As seen in FIG. 5, the double-sided PCBA 500 is disposed on the holder 210 (not seen) within the fix stage such that the defective BGA chip 511 aligns with the end of the muzzle tube 242 of hot air gun 240. The shield body covers 230 (having the sliding covers 231 open) are moved along the rails 220 such that they cover the BGA chips 512a, 512b that are adjacent to the defective chip 511. In embodiments of the inventive subject matter (such as the one illustrated here), the covers 230 can cover more than just the adjacent chips 512a, 512b, protecting more of the BGA chips 512 on the first side 510.

FIG. 5 also shows how the BGA chip 521 contacts the heat-dissipative tube 320 and the adjacent chips 522a, 522b contact the heat-dissipative media 350 spread on the top surface of the heat-dissipative element 340. Other BGA chips 522 beyond the adjacent BGA chips 522a, 522b may also come into contact with the heat-dissipative media 350, which is the case in the example of FIG. 5.

The operation of the system 100 is as follows:

The hot air gun 240 blows hot air toward the defective BGA chip 511 via the muzzle 242 as illustrated by the arrows. The shield body covers 230 (with the sliding covers 231 closed) envelop the adjacent BGA chips 512a, 512b, protecting them from the heat of the hot air.

As this is occurring, the cooling source 310 cools air and sends it down the heat-dissipative tube 320. The thermal resistant coating 330 prevents any external heat from heating the cooled air as it travels down the tube 320. As the air cools the surfaces of the tube 320, the relatively lower temperature of the tube 320 coming into contact with the opposite BGA chip 521 channels the heat away from BGA 521 and to the tube 320, wherein the heat can be dispersed via the open end of the tube 320 as seen by the arrows. Additionally, any heat received by the adjacent BGA chips 522a, 522b is transferred via the heat-dissipative media 350 and then dissipated via the heat-dissipative element 340.

The hot air from the muzzle 242 heats the solder joints underneath the defective BGA chip 511 such that they soften into molten solder paste, allowing for easy removal of the defective BGA chip 511 from the double-sided PCBA 500.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A system for dismantling BGA chips for double-sided PCBA having a symmetrical arrangement of BGA chips on both of a first and a second side of the PCBA, the system comprising:
    a fix stage, comprising:
        a holder configured to hold the double-sided PCBA within the fix stage;
        a hot air gun comprising a hot air source and muzzle tube, the muzzle tube having an end arranged to align with a defective BGA on a first side of the double-sided PCBA;
        at least one heat resistant shield body cover movably disposed along a rail that enables the at least one heat resistant shield body cover to move over the first side and along a long axis of the double-sided PCBA, such that the at least one heat resistant shield body cover can be positioned over a first adjacent BGA chip that is adjacent to the defective BGA chip; and
    a cooling stage comprising:
        a cooling source;
        a heat-dissipative tube fluidly coupled to the cooling source at a first end and aligned at a second end with the end of the muzzle tube such that the second end aligns with a first opposite BGA chip disposed on the second side of the PCBA and that is opposite from the defective BGA chip;
        at least one heat-dissipative element disposed along the second side of the PCBA, the at least one heat-dissipative element aligned with at least one second opposite BGA chip disposed on the second side of the PCBA, the at least one second opposite BGA chip located adjacent to the first opposite BGA chip on the second side of the PCBA; and
        a layer of heat-dissipative media disposed on a side of the at least one heat-dissipative element that faces the second side of the PCBA.

2. The system of claim 1, wherein the at least one heat resistant shield body cover further comprises a sliding cover, the sliding cover disposed on a side of the at least one heat resistant shield body cover that faces the muzzle tube.

3. The system of claim 1, further comprising at least one second heat resistant shield body cover movably disposed along the rail such that the at least one second heat resistant shield body cover can be positioned over a second adjacent BGA chip that is adjacent to the defective BGA chip.

4. The system of claim 1, wherein the at least one heat resistant shield body cover is made of a heat-resistant alloy.

5. The system of claim 1, wherein the at least one heat-dissipative element is made of a heat dissipative alloy that dissipates heat faster than the heat-dissipative tube.

6. The system of claim 1, wherein the heat-dissipative tube is made of a heat- dissipative alloy.

7. The system of claim 1, wherein the holder and the at least one heat- dissipative element are arranged such that the layer of heat-dissipative media comes into contact with the at least one second opposite BGA when the double-sided PCBA is coupled with the holder.

8. The system of claim 1, further comprising a thermal-resistant coating on at least a first side of the heat-dissipative tube.

9. The system of claim 1, wherein the at least one heat-dissipative element comprises at least one heat sink.

10. The system of claim 1, wherein the at least one heat resistant shield body cover slides on the rail.

11. The system of claim 1, wherein the heat-dissipative media comprises thermal paste.

12. The system of claim 1, further comprising a platform, wherein the rails and holder are arranged on a surface of the platform, the platform further comprising cavities dimensioned to receive the heat-dissipative tube and the at least one heat-dissipative element.

13. The system of claim 1, wherein the at least one heat resistant shield body cover is dimensioned such that when it is positioned over the first adjacent BGA chip, it also covers at least one additional BGA chip.

* * * * *